United States Patent
No et al.

(10) Patent No.: US 7,338,752 B2
(45) Date of Patent: *Mar. 4, 2008

(54) METHOD FOR FORMING METAL PATTERN AND ELECTROMAGNETIC INTERFERENCE FILTER USING PATTERN FORMED BY THE METHOD

(75) Inventors: Chang Ho No, Gyeonggi-Do (KR); Jin Young Kim, Gyeonggi-Do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 565 days.

This patent is subject to a terminal disclaimer.

(21) Appl. No.: 10/844,377

(22) Filed: May 13, 2004

(65) Prior Publication Data
US 2005/0003242 A1    Jan. 6, 2005

(30) Foreign Application Priority Data
May 13, 2003   (KR) ................... 10-2003-0030110

(51) Int. Cl.
*G03C 5/00*   (2006.01)
(52) U.S. Cl. .................. 430/315; 977/700; 430/312; 430/321
(58) Field of Classification Search ................ 313/112; 430/315, 321; 977/700
See application file for complete search history.

(56) References Cited

U.S. PATENT DOCUMENTS 7,067,237 B2 *   6/2006   Kim et al. ................... 430/315

2002/0195916 A1*   12/2002   Marutsuka ................... 313/112

FOREIGN PATENT DOCUMENTS

| JP | 01-278800 | 11/1989 |
| JP | 05-16281 | 1/1993 |
| JP | 10-72676 | 3/1998 |
| JP | 2000-323890 A | 11/2000 |
| JP | 2001-168574 A | 6/2001 |
| JP | 2001291721 A * | 10/2001 |

* cited by examiner

Primary Examiner—Mariceli Santiago
Assistant Examiner—Anne M Hines
(74) Attorney, Agent, or Firm—Buchanan Ingersoll & Rooney PC

(57) ABSTRACT

Disclosed herein are a method for forming a highly electrically conductive metal pattern and an electromagnetic interference filter (EMI filter) using a metal pattern formed by the method. The method comprises the steps of (i) coating a photocatalytic compound onto a substrate to form a photocatalytic film, (ii) selectively exposing the photocatalytic film to light to form a latent pattern acting as a nucleus for crystal growth, and (iii) plating the latent pattern to grow metal crystals thereon. The EMI filter comprises the metal pattern. According to the method, a highly electrically conductive metal wiring pattern can be rapidly and efficiently formed, when compared to conventional methods. In addition, the EMI filter comprising the metal pattern not only exhibits excellent performance, but also is advantageous in terms of low manufacturing costs and simple manufacture processes. Accordingly, the EMI filter can be broadly applied to flat panel display devices, such as plasma display panels (PDPs).

9 Claims, 5 Drawing Sheets

1. Coating of Photocatalyst

2. UV Exposure

3. Ag Electroless/ Electro-plating
- Room Temp
- 5~10min

3. Pd Salt solution treatment, followed by Electroless/ Electro-plating

1. Coating of Photocatalyst

<1000 A

2. UV Exposure

Active Site

3. Ag Electoless/
Electro-plating
- Room Temp
- 5~10min

3. Pd Salt solution treatment,
followed by Electroless/
Electro-plating

1. Coating of Photocatalyst

2. UV Exposure

Inactive Site

3. Ag Electroless/ Electro-plating
- Room Temp
- 5~10min

3. Pd Salt solution treatment, followed by Electroless/ Electro-plating

Ag

Cu

METHOD FOR FORMING METAL PATTERN AND ELECTROMAGNETIC INTERFERENCE FILTER USING PATTERN FORMED BY THE METHOD

BACKGROUND OF THE INVENTION

This non-provisional application claims priority under 35 U.S.C. § 119(a) to Korean Patent Application No. 2003-30110 filed on May, 13, 2003 which is herein incorporated by reference.

1. Field of the Invention

The present invention relates to a method for forming a highly electrically conductive metal pattern, and an electromagnetic interference filter (hereinafter, abbreviated as "EMI filter") using a metal pattern formed by the method. More particularly, the present invention relates to a method for forming a metal pattern which comprises the steps of (i) coating a photocatalytic compound onto a substrate to form a photocatalytic film, (ii) selectively exposing the photocatalytic film to light to form a latent pattern acting as a nucleus for crystal growth, and (iii) plating the latent pattern to grow metal crystals thereon; a metal pattern formed by the method; and an EMI filter comprising the metal pattern. According to the method of the present invention, a highly electrically conductive metal wiring pattern can be rapidly and efficiently formed, when compared to conventional methods. In addition, the EMI filter comprising the metal pattern not only exhibits excellent performance, but also is advantageous in terms of low manufacturing costs and simple manufacture processes. Accordingly, the EMI filter can be broadly applied to flat panel display devices, such as plasma display panels (PDPs).

2. Description of the Related Art

In recent years, with a drastically increasing demand for display devices, including plasma display panels as wall-mounted televisions, there has been considerable discussion about static electricity and harmful electromagnetic waves emitted from the display devices. For example, Japanese Patent Laid-open No. Hei 1-278800 discloses a method for forming a transparent electrode on a display plane of a screen by a sputtering or deposition process; Japanese Patent Laid-open No. 2000-323890 describes a method for forming a mesh pattern by coating an adhesive agent layer-laminated conductive film onto a transparent substrate and for forming a pattern on the conductive film using a photoresist or a printable resist material and metal-etching. According to the former method, the film has a thickness between 100 Å and 2,000 Å in order to shield harmful electromagnetic waves and to ensure the transmittance of visible light emitted from PDP devices. However, within the range of the film thickness, the electromagnetic wave shielding effect is unsatisfactory (FIG. 1). In addition, the latter method has problems of high manufacturing costs and an additional need for a near-infrared film to operate remote controllers for household electronic products (FIGS. 2 and 3). As alternative examples, Japanese Patent Laid-open Nos. Hei 5-16281 and 10-72676 disclose a method for manufacturing an electromagnetic wave shielding film involving the following steps: laminating a transparent resin layer onto a transparent substrate, e.g., made of polycarbonate; electroless copper plating on the resin layer; and forming a mesh pattern thereon by an etching process, e.g., microphotolithography (FIG. 4). Although this method is advantageous for easy treatment of the metal thin film, it is disadvantageous in that the composition of an etching solution, the etching temperature and the etching time are difficult to manage upon etching by photolithography. Furthermore, Japanese Patent Laid-open No. 2001-168574 suggests a method for forming a mesh pattern without undergoing etching. According to this method, a transparent resin film containing reducing metal particles (electroless plating catalyst) is laminated onto a transparent substrate; a catalyst present at an opening portion formed on a mesh pattern is deactivated or washed out with a dissolution agent; an electromagnetic wave or electronic beam is irradiated thereto; and finally only the catalyst is subjected to electroless plating to form an electromagnetic wave shielding film on the mesh pattern. However, the method involves the use of additional processes, e.g., the catalyst present at the opening portion must be deactivated by an inkjet process, or a pattern must be formed using a photoresist before deactivation. Accordingly, the overall process conditions of the method are complicated despite the absence of etching.

Thus, there exists a need in the art for a method for forming a highly electrically conductive metal wiring pattern, wherein the metal wiring pattern can be rapidly and efficiently formed in a simple manner without the necessity of additional processes, e.g., a process for forming a metal thin film requiring high vacuum and high temperature conditions, or an exposure process for forming a fine pattern and a subsequent etching process. There is also a need for a method for forming a metal pattern which can be used to manufacture an EMI filter with excellent performance.

SUMMARY OF THE INVENTION

The present inventors have earnestly and intensively conducted research to solve the above-mentioned problems. As a result, the present inventors have found the following: when a compound whose reactivity is changed by light, i.e. a photocatalytic compound, is coated onto a substrate to form a photocatalytic film, and the photocatalytic film is selectively exposed to light to form a latent pattern acting as a nucleus for crystal growth by photoreaction, and the latent pattern is plated to grow metal crystals, a metal pattern can be rapidly and efficiently formed in comparison with conventional methods. Furthermore, an EMI filter comprising the metal pattern not only exhibits excellent performances, but also is advantageous in terms of low manufacturing costs and simple manufacture processes, thus accomplishing the present invention. The EMI filter thus manufactured can be broadly applied to flat panel display devices such as plasma display panels.

Therefore, it is a feature of the present invention to provide a method for forming a metal pattern wherein the metal pattern can be rapidly and efficiently formed in a simple manner without the necessity of additional processes, e.g., a process for forming a metal thin film requiring high vacuum and high temperature conditions, or an photolithography process for forming a fine pattern and a subsequent etching process.

It is another feature of the present invention to provide an EMI filter having excellent performance which is manufactured using a metal pattern formed by the method.

In accordance with the features of the present invention, there is provided a method for forming a metal pattern, comprising the steps of: (i) coating a photocatalytic compound onto a substrate to form a photocatalytic film; (ii) selectively exposing the photocatalytic film to light to form a latent pattern acting as a nucleus for crystal growth; and (iii) plating the latent pattern to grow metal crystals thereon.

If necessary, the method of the present invention may further comprise the step of, prior to step (iii), treating the latent pattern formed in step (ii) with a metal salt solution to form a metal particle-deposited pattern thereon.

In accordance with the features of the present invention, there is further provided an EMI filter comprising a metal pattern formed by the method.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, the present invention will be explained in more detail, based on the respective steps.

Figure 1:
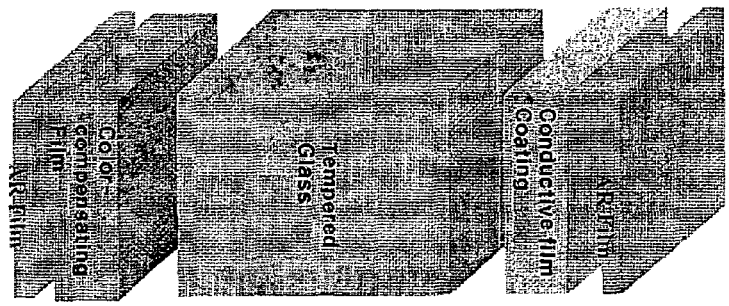
FIG. 1 is a diagram schematically showing the structure of a transparent conductive film-type EMI filter.
Figure 2:
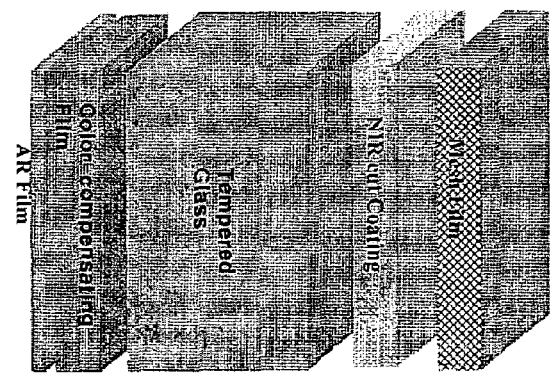
FIG. 2 is a diagram schematically showing the structure of a metal mesh pattern-type EMI filter.
Figure 3:
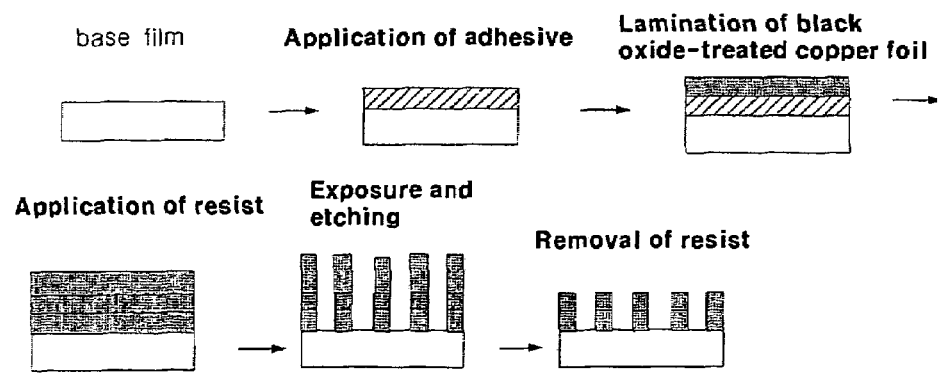
FIG. 3 is an exemplary diagram schematically showing a conventional method for forming a metal mesh pattern-type metal pattern.
Figure 4:
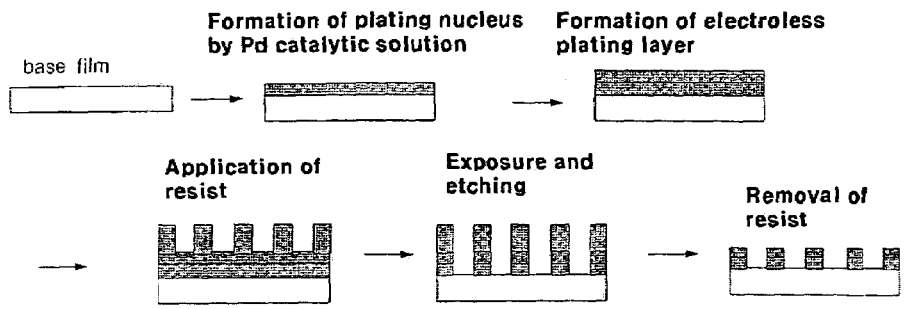
FIG. 4 is an exemplary diagram schematically showing a conventional method for forming a metal mesh pattern by an electroless plating process.
Figure 5:
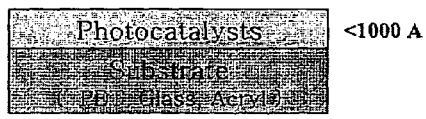
FIG. 5 is an exemplary diagram schematically showing a method for forming a negative-type metal mesh pattern according to the present invention.
Figure 5:
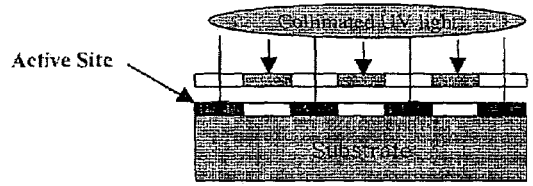
Figure 5:
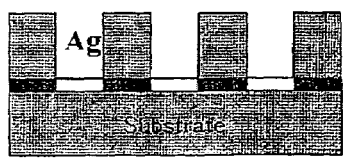
Figure 5:
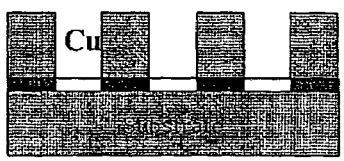
Figure 6:
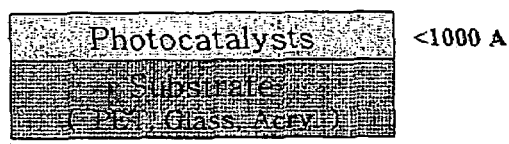
FIG. 6 is an exemplary diagram schematically showing a method for forming a positive-type metal mesh pattern according to the present invention.
Figure 6:
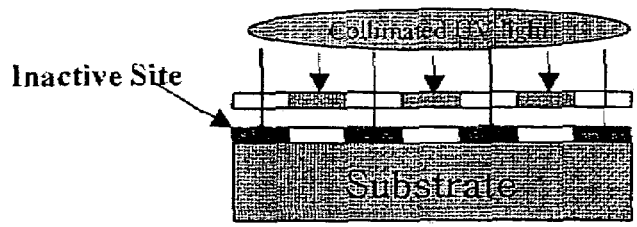
Figure 6:
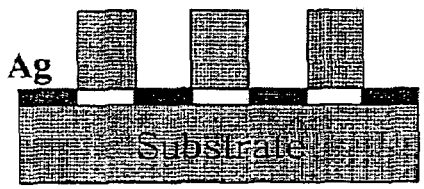
Figure 6:
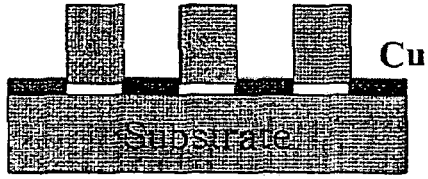

Step (i):

First, a photocatalytic compound is coated onto a substrate to form a photocatalytic film. The term "photocatalytic compound" as used herein refers to a compound whose characteristics are drastically changed by light. Some photocatalytic compounds are inactive when not exposed to light, but their reactivity is accelerated upon being exposed to light, e.g., UV light. Alternatively, some photocatalytic compounds are active when not exposed to light, but their reactivity is lost and they become inactive upon exposure to light, e.g., UV light. In the former case, a negative-type latent pattern can be formed at subsequent step (ii) (see, FIG. 5). On the other hand, in the latter case, a positive-type latent pattern can be formed at subsequent step (ii) (see, FIG. 6).

Photocatalytic compounds usable to form the negative-type latent pattern in the present invention are preferably those having inactivity before light exposure, but which are electron-excited by photoreaction upon light exposure, and are therefore capable of exhibiting a reducing ability. More preferably, the photocatalytic compounds are Ti-containing organometallic compounds which can form $TiO_x$ (in which x is a number of not higher than 2) upon exposure to light. Examples of suitable Ti-containing organometallic compounds include tetraisopropyltitanate, tetra-n-butyltitinate, tetrakis(2-ethyl-hexyl)titanate and polybutyltitanate.

Photocatalytic compounds usable to form the positive-type latent pattern in the present invention are preferably those having activity before light exposure, but which are oxidized by photoreaction upon light exposure, thus losing their activity in the exposed portion. More preferably, the photocatalytic compounds are Sn-containing compounds. Examples of suitable Sn-containing compounds include $SnCl(OH)$ and $SnCl_2$.

Following dissolving the photocatalytic compound in an appropriate solvent, e.g., isopropyl alcohol, the coating of the solution onto the transparent substrate can be conducted by spin coating, spray coating, screen printing process or the like.

The substrate usable in the present invention is not specially limited, but is preferably a transparent plastic or glass substrate. As examples of the transparent plastic substrate, acrylic resins, polyesters, polycarbonates, polyethylenes, polyethersulfones, olefin maleimide copolymers, norbornene-based resins, etc. can be mentioned. In the case where excellent heat resistance is required, olefin maleimide copolymers and norbornene-based resins are preferred. Otherwise, it is preferred to use polyester films, acrylic resins and the like as the transparent plastic substrate.

Step (ii):

The photocatalytic film formed in step (i) above is selectively exposed to UV light through a photomask to form a latent pattern acting as a nucleus for crystal growth, which consists of active sites and inactive sites. If necessary, the latent pattern may be treated with a metal salt solution to form a metal particle-deposited pattern thereon.

Exposure atmospherics and exposure dose for exposing the photocatalytic film are not especially limited, and can be properly selected according to the kind of photocatalytic compound used.

Figure 7:
FIG. 7 depicts electron excitation in the photocatalytic compound.
Figure 7:
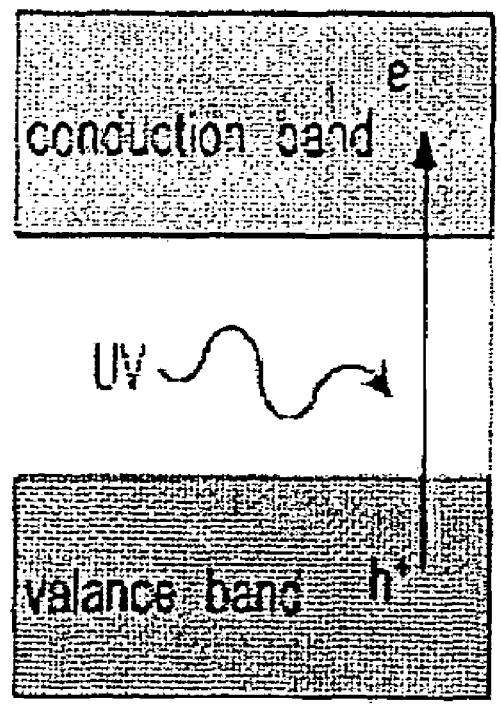

Upon light exposure of the photocatalytic film to form the negative-type latent pattern, electron excitation takes place only in the exposed portion of the photocatalytic film. This electron excitation makes the photocatalytic compound in the exposed portion active, allowing metal ions present in the exposed portion to be reduced into metals, as depicted in FIG. 7.

Figure 8:
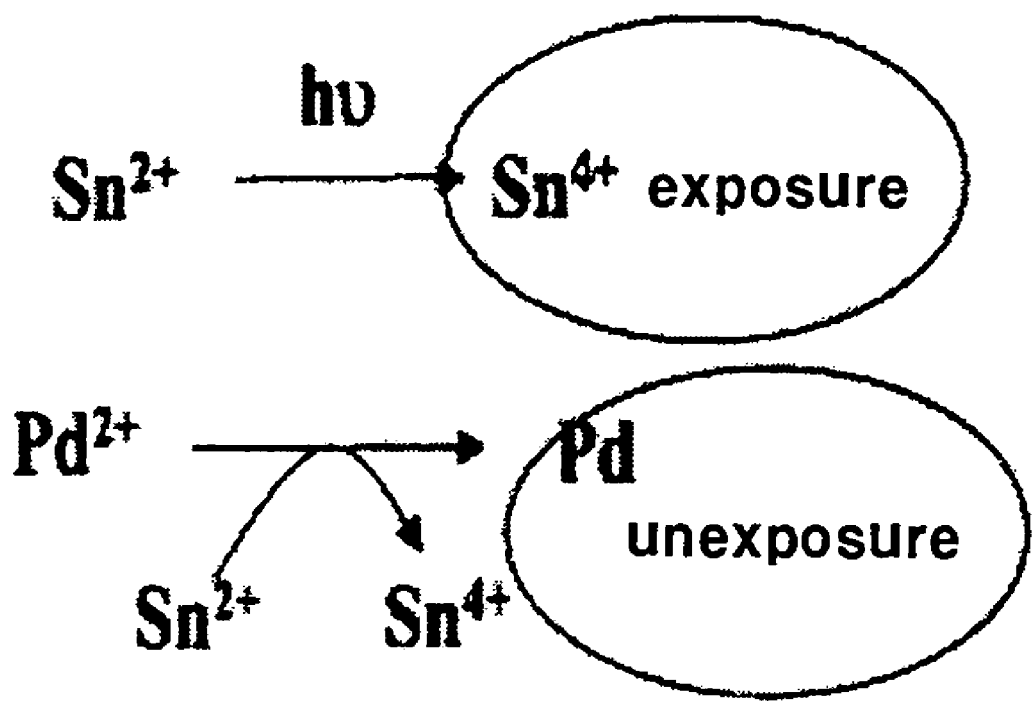
FIG. 8 depicts reduction in an active metal.

On the other hand, upon light exposure of the photocatalytic film to form the positive-type latent pattern, oxidation takes place in the exposed portion of the photocatalytic film. Due to the oxidation, the photocatalytic compound in the exposed portion loses its activity and that of the unexposed portion maintains it activity. Accordingly, metal ions present in the unexposed portion are reduced to an active metal, as depicted in FIG. 8.

In this step, if necessary, the latent pattern acting as a nucleus for crystal growth may be treated with a metal salt solution to form a metal particle-deposited pattern thereon, in order to effectively form a more dense metal pattern in subsequent step (iii). Specifically, the latent pattern is immersed in an appropriate metal salt solution. At this time, the deposited metal particles play a roll as catalysts accelerating metal crystal growth in a subsequent plating process. When the pattern is plated with copper, nickel or gold, the treatment with the metal salt solution is preferably carried out. As the metal salt solution, Ag salt solution, Pd salt solution or a mixed solution thereof is preferably used.

Step (iii):

The latent pattern acting as a nucleus for crystal growth formed in step (ii), or if necessary, the metal particle-deposited pattern are subjected to plating to grow metal crystals, thereby forming a final metal pattern. The plating is performed by an electroless or electro-plating process.

In the case of the metal particle-deposited pattern formed by immersing the latent pattern in a Pd salt or Ag salt solution, since the palladium or silver metal particles exhibit a sufficient activity as catalysts in an electroless plating solution, the crystal growth is accelerated. Accordingly, a more densely packed metal pattern can be advantageously formed.

As a plating metal used in this step, Cu, Ni, Ag, Au and an alloy thereof may be mentioned. The kind of plating metal may be appropriately determined according to the type of the final metal pattern. In order to form a highly electrically conductive metal pattern, a solution of a copper or silver compound is preferably used.

The electroless or electro-plating is achieved by a well-known procedure. A more detailed explanation will be described below.

In the case that an electroless plating process is employed to grow copper crystals, the substrate on which the latent pattern acting as a nucleus for crystal growth is formed is immersed in a plating solution having a composition consisting of 1) a copper salt, 2) a reducing agent, 3) a complexing agent, 4) a pH-adjusting agent, 5) a pH buffer and 6) a modifying agent. The copper salt of 1) serves as a source providing copper ions. Examples of the copper salt include copper chloride, copper sulfate and copper cyanide. Copper sulfate is preferred. The reducing agent of 2) acts to reduce metal ions present on the substrate. Specific examples of the reducing agent include $NaBH_4$, $KBH_4$, $NaH_2PO_2$, hydrazine, formaline, and polysaccharides (e.g., glucose). Formaline and polysaccharides (e.g, glucose) are preferred. The complexing agent of 3) functions to prevent the precipitation of hydroxides in an alkaline solution and to control the concentration of free metal ions, thereby preventing the decomposition of metal salts and adjusting the plating speed. Specific examples of the complexing agent include ammonia solution, acetic acid, guanine acid, tartaric acid, chelating agents (e.g., EDTA) and organic amine compounds. Chelating agents (e.g., EDTA) are preferred. The pH-adjusting agent of 4) plays a roll in adjusting the pH of the plating solution, and is selected from acidic or basic compounds. The pH buffer of 5) inhibits the sudden change in the pH of the plating solution, and is selected from organic acids and weakly acidic inorganic compounds. The modifying agent of 6) is a compound capable of improving coating and planarization characteristics. Specific examples of the modifying agent include surfactants and adsorptive substances capable of adsorbing components interfering the crystal growth.

In the case that an electro-plating process is employed to grow copper crystals, the substrate on which the latent pattern acting as a nucleus for crystal growth is formed is immersed in a plating solution having a composition consisting of 1) a copper salt, 2) a complexing agent, 3) a pH-adjusting agent, 4) a pH buffer and 5) a modifying agent. The functions and the specific examples of the components contained in the plating solution composition are as defined above in the electroless-plating process.

In the case that an electroless plating process is employed to grow silver crystals, the substrate on which the latent pattern acting as a nucleus for crystal growth is formed is immersed in a plating solution having a composition consisting of 1) a silver salt, 2) a reducing agent, 3) a complexing agent, 4) a pH-adjusting agent, 5) a pH buffer and 6) a modifying agent. The silver salt of 1) serves as a source providing silver ions to the metal wiring. Specific examples of the silver salt include silver chloride, silver nitrate and silver cyanide. Silver nitrate is preferred. The functions and the specific examples of the other components contained in the plating solution composition are as defined above.

In the case that an electro-plating process is employed to grow silver crystals, the substrate on which the latent pattern acting as a nucleus for crystal growth is formed is immersed in a plating solution having a composition consisting of 1) a silver salt, 2) a complexing agent, 3) a pH-adjusting agent, 4) a pH buffer and 5) a modifying agent. The functions and the specific examples of the components contained in the plating solution composition are as defined above.

EXAMPLES

The constitution and effects of the present invention will now be described in more detail with reference to the following preferred examples. However, these examples are given for the purpose of illustration and are not to be construed as limiting the scope of the invention.

Formation of Latent Pattern Acting as Nucleus for Crystal Growth: Negative-Type

Formation Example 1

After a solution of polybutyltitanate (2.5 wt %) in isopropanol was coated onto a transparent polyester film as a substrate by spin coating, the resulting film was dried at 150° C. for 5 minutes so as to have a thickness of 30 to 50 nm. UV light having a broad wavelength range was irradiated to the substrate through a photomask on which a fine mesh pattern was formed using a UV exposure apparatus (Oriel, U.S.A). After exposure, the substrate was immersed in a solution of 0.6 g of $PdCl_2$ and 1 ml of HCl in 1 l of water to deposit Pd particles on the surface of the exposed portion. As a result, a negative pattern composed of Pd, acting as a nucleus for crystal growth, was formed.

Formation of Latent Pattern Acting as Nucleus for Crystal Growth: Positive-Type

Formation Example 2

First, 22 g of $SnCl_2$ was dissolved in 1 l of water and then 10 ml of hydrochloric acid was added thereto to obtain a solution. After a transparent polyester film as a substrate was immersed in the solution for 1 minute, the resulting substrate was dried at 100° C. for 2 minutes to form a photocatalytic compound-coated substrate having a thickness of 50 nm or less. UV light having a broad wavelength range was irradiated to the substrate through a photomask on which a fine mesh pattern was formed using a UV exposure apparatus (Oriel, U.S.A). After exposure, the substrate was immersed in a solution of 0.6 g of $PdCl_2$ and 1 ml of HCl in 1 l of water to deposit Pd particles on the surface of the unexposed portion. As a result, a positive pattern composed of Pd, acting as a nucleus for crystal growth, was formed.

Example 1

Formation of Negative-Type Copper Wiring by Electroless Copper Plating

The substrate prepared in Formation Example 1 above was immersed in an electroless copper plating solution to selectively grow crystals of a copper wire. At this time, the electroless copper plating solution was prepared so as to have the composition indicated in Table 1(a) below. The basic physical properties of the copper wiring are shown in Table 2 below. The thickness of the copper wiring was measured using α-step (manufactured by Dektak), and the specific resistance was measured using a 4-point probe. The resolution was determined using an optical microscope, and the adhesive force was confirmed by a scotch tape peeling test. The electromagnetic wave shielding effect was evaluated by measuring the penetration degree of an electromagnetic wave having a frequency range of 30-1,000 MHz.

Example 2

Formation of Negative-Type Silver Wiring by Electroless Silver Plating

A substrate was prepared in the same manner as in Formation Example 1 above, except that the substrate was not treated with Pd salt solution. The resulting substrate was immersed in an electroless silver plating solution to selectively grow crystals of a silver wire. The electroless silver plating solution was prepared so as to have the composition indicated in Table 1(b) below. The basic physical properties of the silver wiring were measured in the same methods shown in Example 1. The results are listed in Table 2 below.

Example 3

Formation of Positive-Type Copper Wiring by Electroless Copper Plating

The substrate prepared in Formation Example 2 above was immersed in an electroless copper plating solution to selectively grow crystals of a copper wire. At this time, the electroless copper plating solution was prepared so as to have the composition indicated in Table 1(a) below. The basic physical properties of the copper wiring were measured in the same methods shown in Example 1. The results are listed in Table 2 below.

Example 4

Formation of Positive-Type Silver Wiring by Electroless Silver Plating

A substrate was prepared in the same manner as in Formation Example 2 above, except that the substrate was not treated with Pd salt solution. The resulting substrate was immersed in an electroless silver plating solution to selectively grow crystals of a silver wire. The electroless silver plating solution was prepared so as to have the composition indicated in Table 1(b) below. The basic physical properties of the silver wiring were measured using the same methods shown in Example 1. The results are listed in Table 2 below.

TABLE 1

| (a) Copper plating solution | | (b) Silver plating solution | |
|---|---|---|---|
| Copper sulfate | 3.5 g | Silver nitrate | 4 g |
| Rochelle salt | 8.5 g | Glucose | 45 g |
| Formaline (37%) | 22 ml | Rochelle salt | 4 g |
| Thiourea | 1 g | Polyvinyl alcohol | 1.5 g |
| Ammonia | 1 l | Ethanol | 100 ml |
| 35° C./5 min. | | 40° C./30 sec. | |

TABLE 2

| Example No. | Film thickness (Å) | Specific resistance (μohm-cm) | Resolution (μm) | Adhesive force | Electromagnetic wave shielding effect |
|---|---|---|---|---|---|
| Example 1 | 2865 | 2.7 | <5 | Good | Good |
| Example 2 | 2517 | 2.3 | <5 | Good | Good |
| Example 3 | 2680 | 3.1 | <5 | Good | Good |
| Example 4 | 2650 | 2.6 | <5 | Good | Good |

According to the method of the present invention, a metal pattern can be formed by forming a photocatalytic compound thin film by a simple coating process, instead of a conventional physical deposition process, followed by a simple plating treatment. Accordingly, a highly electrically conductive metal wiring pattern can be rapidly and efficiently formed without involving a sputtering process requiring high vacuum condition, a photopatterning process using a photosensitive resin and an etching process. In addition, an EMI filter comprising the metal pattern not only exhibits performances comparable to conventional EMI filters, but also is advantageous in terms of low manufacturing costs and simple manufacture processes.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a metal pattern, comprising the steps of:
   (i) coating a photocatalytic compound onto a substrate to form a photocatalytic film;
   (ii) selectively exposing the photocatalytic film to light to form a latent pattern acting as a nucleus for crystal growth;
   (iii) treating the latent pattern formed in step (ii) with a metal salt solution to form a metal particle-deposited pattern thereon, and
   (iv) plating the latent pattern bearing said metal particles to grow metal crystals thereon.

2. The method according to claim 1, wherein the metal salt solution (iii) is a palladium salt solution, a silver salt solutions or a mixed solution thereof.

3. The method according to claim 1, wherein the photocatalytic compound is either (a) a compound having inactivity before light exposure, but which exhibits a reducing ability upon light exposure; or (b) a compound having activity before light exposure, but which loses its activity through oxidation upon light exposure.

4. The method according to claim 3, wherein the photocatalytic compound is a Ti-containing organometallic compound having inactivity before light exposure which can form $TiO_x$ wherein x is 0, 1, or 2, upon exposure to light.

5. The method according to claim 4, wherein the Ti-containing organometallic compound is selected from a group consisting of tetraisopropyltitanate, tetra-n-butyltitinate, tetrakis(2-ethyl-hexyl )titanate and polybutyltitanate.

6. The method according to claim 3 wherein the photocatalytic compound is a Sn-containing organometallic compound having activity before light exposure but which loses its activity through oxidation upon light exposure.

7. The method according to claim 6, wherein the Sn-containing organometallic compound is either SnCl(OH) or $SnCl_2$.

8. The method according to claim 1, wherein the plating in step (iv) is performed by an electroless or electroplating process.

9. The method according to claim 8, wherein the plating metal is selected from the group consisting of Cu, Ni, Ag, Au and alloys thereof.

* * * * *